United States Patent
Takeguchi et al.

(10) Patent No.: US 6,215,717 B1
(45) Date of Patent: Apr. 10, 2001

(54) SEMICONDUCTOR MEMORY DEVICE FOR REDUCING A TIME NEEDED FOR PERFORMING A PROTECTING OPERATION

(75) Inventors: Tetsuji Takeguchi; Haruo Shoji, both of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/161,262

(22) Filed: Sep. 28, 1998

(30) Foreign Application Priority Data

Jan. 27, 1998 (JP) .................................................. 10-014390

(51) Int. Cl.⁷ ...................................................... G11C 8/00
(52) U.S. Cl. ................................ 365/230.03; 365/189.05; 365/230.08
(58) Field of Search ............................. 365/230.03, 233, 365/189.07, 230.06, 189.05, 194, 195, 230.08

(56) References Cited

U.S. PATENT DOCUMENTS

| | | | |
|---|---|---|---|
| 5,119,336 | * | 6/1992 | Itoh ....................................... 365/195 |
| 5,396,471 | * | 3/1995 | Kitsu ................................. 365/230.01 |
| 5,406,516 | * | 4/1995 | Ihara et al. ........................ 365/189.01 |
| 5,422,856 | * | 6/1995 | Sasaki et al. ..................... 365/230.03 |
| 5,668,760 | * | 9/1997 | Hazen ................................ 365/189.01 |
| 5,802,583 | * | 9/1998 | Yeager et al. ........................... 711/152 |
| 5,818,771 | * | 10/1998 | Yasu et al. ............................. 365/145 |
| 5,917,750 | * | 6/1999 | Miyakwa et al. ................ 365/185.04 |
| 5,933,595 | * | 8/1999 | Iizuka et al. ...................... 395/183.11 |

FOREIGN PATENT DOCUMENTS 4-311235    11/1992   (JP) .

* cited by examiner

*Primary Examiner*—Richard Elms
*Assistant Examiner*—Hien Nguyen
(74) *Attorney, Agent, or Firm*—Armstrong, Westerman, Hattori, McLeland & Naughton, LLP

(57) ABSTRACT

A semiconductor memory device which can reduce a time required for a write-protection setting operation when a plurality of blocks are to be write-protected. A write area of the semiconductor memory device is divided into a predetermined number of blocks each of which is rewritable on an individual block basis. Write-protection information is simultaneously provided to a plurality of blocks that are arbitrarily designated from among the predetermined number of blocks so that the plurality of blocks are simultaneously subjected to the write-protection setting operation.

10 Claims, 12 Drawing Sheets

SEMICONDUCTOR MEMORY DEVICE FOR REDUCING A TIME NEEDED FOR PERFORMING A PROTECTING OPERATION

BACKGROUND OF THE INVENTION

1. Field of the Invention

The present invention generally relates to a semiconductor memory device and, more particularly, to a semiconductor memory device having a write area divided into a plurality of blocks so that written information can be protected from being rewritten on an individual block basis.

Recently, in association with unity with regard to a power source for non-volatile semiconductor memory devices, a demand for a function to prevent recorded information from being erroneously rewritten, that is, a write-protection function, has been increased.

2. Description of the Related Art

A conventional semiconductor device has a write area divided into a plurality of blocks, and written information in the write area is prevented from being rewritten. This function is referred to as a write-protection function. A setting operation of the write protection is performed on an individual block basis.

A description will now be given, with reference to FIG. 1, of a write-protection circuit provided in the conventional semiconductor device.

The write-protection circuit 201 shown in FIG. 1 comprises: a write-protection control circuit 212 which controls an operation for setting write-protection information; an input buffer circuit 23 which inputs an address signal for designating a block to be write-protected; a decode circuit 24 which decodes the address signal so as to designate the block to which the write-protection information is set; and a write-protection setting circuit 211 which performs the operation for setting the write-protection to the block designated by the operation of the write-protection control circuit 212.

The write-protection circuit 201 performs the write-protection setting operation based on the address signal and externally input control signals such as an output enable signal OE and a write enable signal WE. That is, when there is a plurality of blocks to be write-protected, a plurality of write-protection setting operations are performed for the blocks on an individual block basis.

It should be noted that the write-protection circuit 201 of the conventional semiconductor memory device uses an address signal A6 as a control signal for the write-protection setting operation. Additionally, the write-protection circuit 201 uses the uppermost address signals A14, A15 and A16 (represented as Ai in FIG. 1) as a signal for designating a block to which the write-protection setting operation is applied.

The write-protection setting circuit 211 includes, as shown in FIG. 2, write-protection memory circuits 221a through 221g each of which stores the write-protection information for a respective one of the blocks. The write protection is set by storing the write-protection information in each of the write-protection memory circuits 221a through 221g.

Additionally, the conventional semiconductor device turns on an N-channel transistor 33 by changing a signal PDC3 shown in FIG. 2 from 0 Vcc to 0.5 Vcc each time a data writing operation is performed so as to read a write-protection signal WP which corresponds to the write-protection information provided to the block to which the data write operation is applied. That is, the write-protection signal to be read is the write-protection information stored in one of the protection memory circuits 211a through 221g provided to one of the blocks to which the data write operation is to be performed. It should be noted that the write-protection information represents whether the write-protection for each of the blocks is set or canceled.

Specifically, the conventional semiconductor memory device recognizes that the block is write-protected when the write-protection signal WP is at a high level ("H"). On the other hand, when the write-protection signal WP is at a low level ("L"), it is recognized that the write-protection of the block has been canceled.

A description will now be given, with reference to FIG. 3, of a write-protection setting operation performed by the write-protection circuit 201.

When the address signal Ai (A14, A15, A16) is input to the input buffer circuit 23, the decode circuit 24 decodes the address signal Ai so as to designate one of the blocks to which the write-protection setting operation is applied. For example, when the block 0 is designated, a block signal BLK0 is set to the high level (FIG. 3-①).

FIG. 4 is a circuit diagram of the write-protection control circuit 212 shown in FIG. 1. In the above-mentioned state, when the control signal OE/ is recognized by a high-voltage detecting circuit 41, and the effective address signal A6 and the control signal WE/ are input to a NAND gate 47 via input buffer circuits 42 and 43, respectively, the write-protection control circuit 212 outputs a write signal WPP and a control gate signal WPG via inverters 48 and 49, respectively.

Specifically, when the control signal OE=12V, the address signal A6="L", and the control signal WE="L", the write-protection control circuit 212 sets the write signal WPP and the control gate signal WPG to "H" (FIG. 3-②) so as to control the write-protection setting operation of the write-protection setting circuit 211.

When both the signals WPP and WPG are "H", the write-protection setting circuit 211 stores the write-protection information in one of the write-protection memory circuits 221a to 221g. In the present case, the write-protection information is stored in the protection memory circuit 221a which corresponds to the block 0 (the block signal BLK0). Each of the write-protection memory circuits 221a to 221g comprises, as shown in FIG. 5, a memory circuit which is a content addressable memory (CAM) cell 81, a P-channel transistor 82, an N-channel transistor 83 and a NAND gate 84. Each of the write-protection memory circuits 221a to 221g stores the protection information corresponding to the designated block based on the signals WPP and WPG.

As mentioned above, the conventional write-protection circuit 201 performs the write-protection setting operation with respect to the block 0 (BLK0), and thereafter sequentially performs the write-protection setting operation for other blocks (BLKn) one after another (FIG. 3-③, ④, ⑤, ⑥, ⑦, ⑧)

As mentioned above, the conventional semiconductor memory device must perform a plurality of write-protection setting operations when there are a plurality of blocks to be write-protected. Accordingly, there is a problem in that a relatively long time is required to set the write protection to all of the blocks to be write-protected. Specifically, a time for setting all of the blocks to be write-protected is calculated by multiplying a time (about 100 microseconds) needed to perform the write-protection setting operation for a single block by a number of blocks to be write-protected.

SUMMARY OF THE INVENTION

It is a general object of the present invention to provide a semiconductor memory device in which the above-mentioned problems are eliminated.

A more specific object of the present invention is to provide a semiconductor memory device which can reduce a time required for a write-protection setting operation when a plurality of blocks are to be write-protected by simultaneously performing the write-protection setting operations for all of the blocks to be write-protected.

In order to achieve the above-mentioned objects, there is provided according to the present invention a semiconductor memory circuit, comprising:

a write area divided into a predetermined number of blocks each of which is rewritable on an individual block basis; and write-protection means for simultaneously setting write-protection information to a plurality of blocks that are arbitrarily designated from among the predetermined number of blocks so that the plurality of blocks are protected from being rewritten.

According to the above-mentioned invention, an arbitrary number of blocks are simultaneously subjected to the write-protection setting operation. Thus, each of the blocks to be write-protected is not required to be subjected to the write-protection setting operation at a different time. This reduces a time required for the write-protection operation when there is a plurality of blocks to be write-protected.

In the semiconductor memory device according to the present invention, the write-protection means may comprise:

decode means for decoding an address signal for designating said plurality of blocks to which the write-protection information is set; and write-protection control means for controlling an operation for setting the write-protection information based on externally provided control signals, wherein the write-protection means simultaneously sets the write-protection information to the plurality of blocks designated by the decode means under a control of the write-protection control means.

According to this invention, the blocks to be write-protected can be recognized by the decoded address signal and the control signals input to the write-protection control means.

Additionally, the write-protection means may further comprise:

latch means for latching a decode signal on an individual block basis, the decode signal indicating the plurality of blocks to which the write-protection information is to be provided; and write-protection memory means for storing the write-protection information on an individual block basis based on the decode signal latched by the latch means, wherein the decode signal corresponding to the plurality of blocks is previously latched by said latch means, and, thereby, the write-protection information is simultaneously set to the plurality of blocks to which the write-protection information is to be provided.

According to this invention, since the decode signal which indicates the blocks to be write-protected is latched before the write-protection setting operation is performed, the blocks to be write-protected are subjected to the write-protection setting operation at the same time.

Additionally, in the semiconductor memory device according to the present invention, the write-protection means may further comprise:

input signal decode means for decoding input signals other than the address signal so as to designate at least one of the blocks other than the block designated by the decode means at the same time when the block is designated by said decode means; and write-protection memory means for storing the write-protection information on an individual block basis based on a first decoded signal obtained by the decode means and a second decoded signal obtained by the input-signal decode means, wherein the write-protection information is set to a plurality of blocks designated by the decode means and the input signal decode means.

According to this invention, at least one block other than the block designated by the decode means can be designated as one of the blocks to be write-protected by using the input signal other than the address signal. Thus, if one block is designated as a block to be write-protected by the decode means, other blocks can be designated to be write-protected by the input-signal decode means in relation to the block designated by the decode means.

Additionally, the block designated by the input signal decode means and the block designated by the decode means may be consecutively arranged with the block designated by the decode means being positioned at the beginning or at the end of the consecutive blocks. This is particularly effective for a flash memory which stores programs for a basic input/output system (BIOS). The flash memory storing the programs of the BIOS is provided with boot blocks for storing boot programs. The boot blocks must be arranged from the first block position. Since the BIOS is not rewritten in a regular operation, a plurality of consecutive blocks starting from the first block position which correspond to the boot blocks are write-protected in the flash memory storing the programs of the BIOS. According to the present invention, the first block and a predetermined number of subsequent blocks can be designated as blocks to be write-protected at the same time.

Other objects, features and advantages of the present Invention will become more apparent from the following detailed descriptions when read in conjunction with the accompanying drawings.

DETAILED DESCRIPTION OF THE PREFERRED EMBODIMENTS

Figure 1:
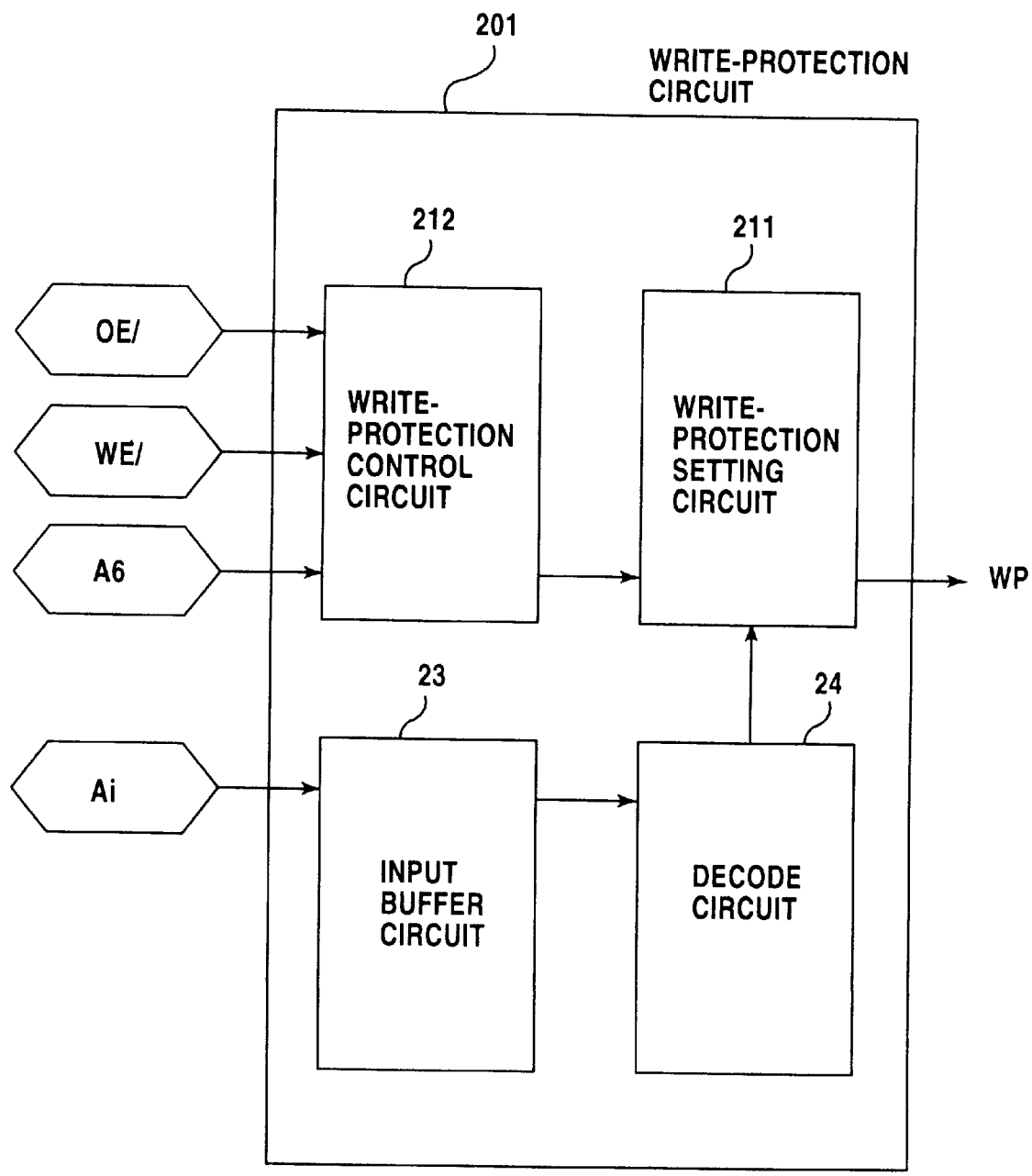
FIG. 1 is a block diagram of a conventional write-protection circuit.
Figure 2:
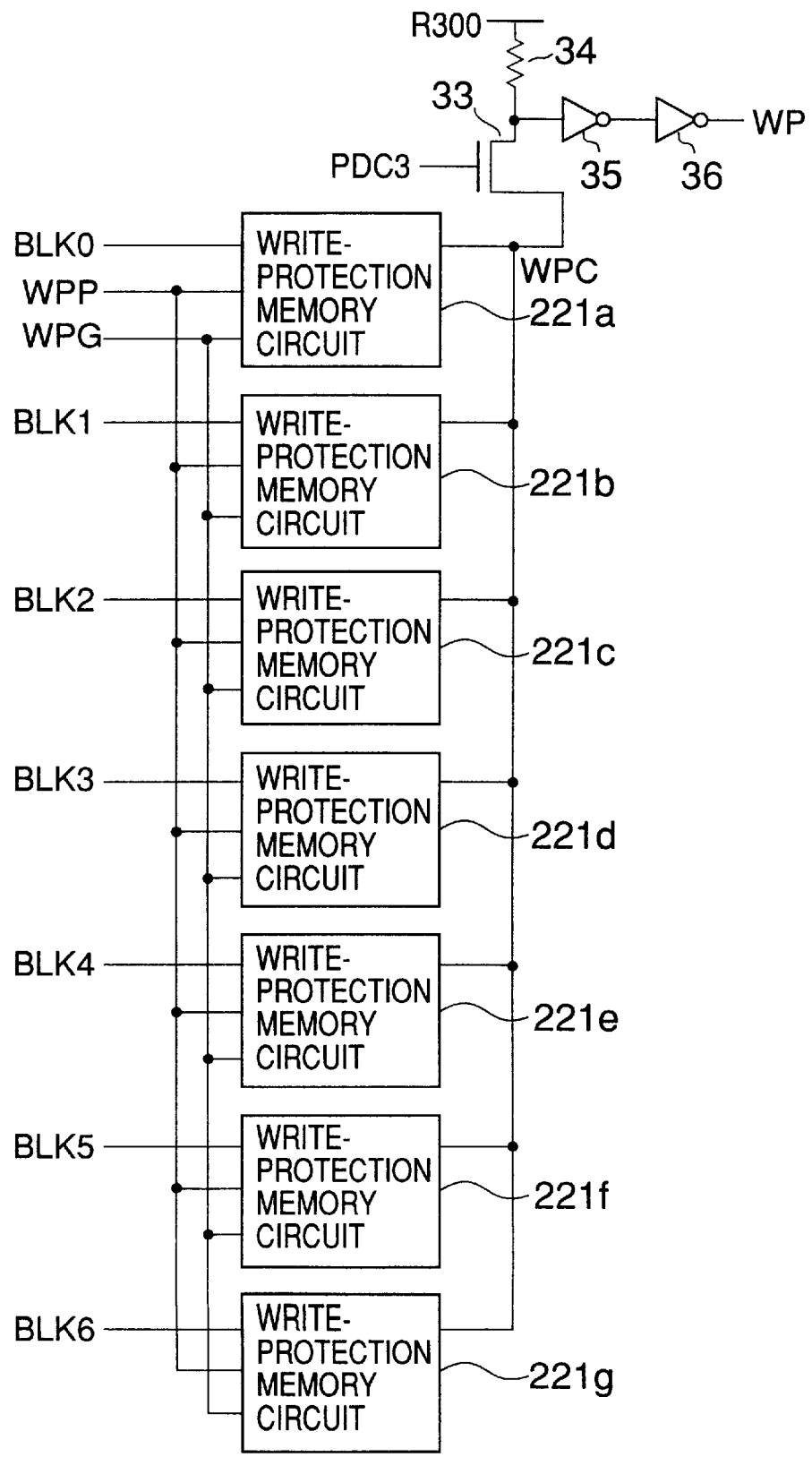
FIG. 2 is a circuit diagram of a write-protection setting circuit shown in FIG. 1.
Figure 3:
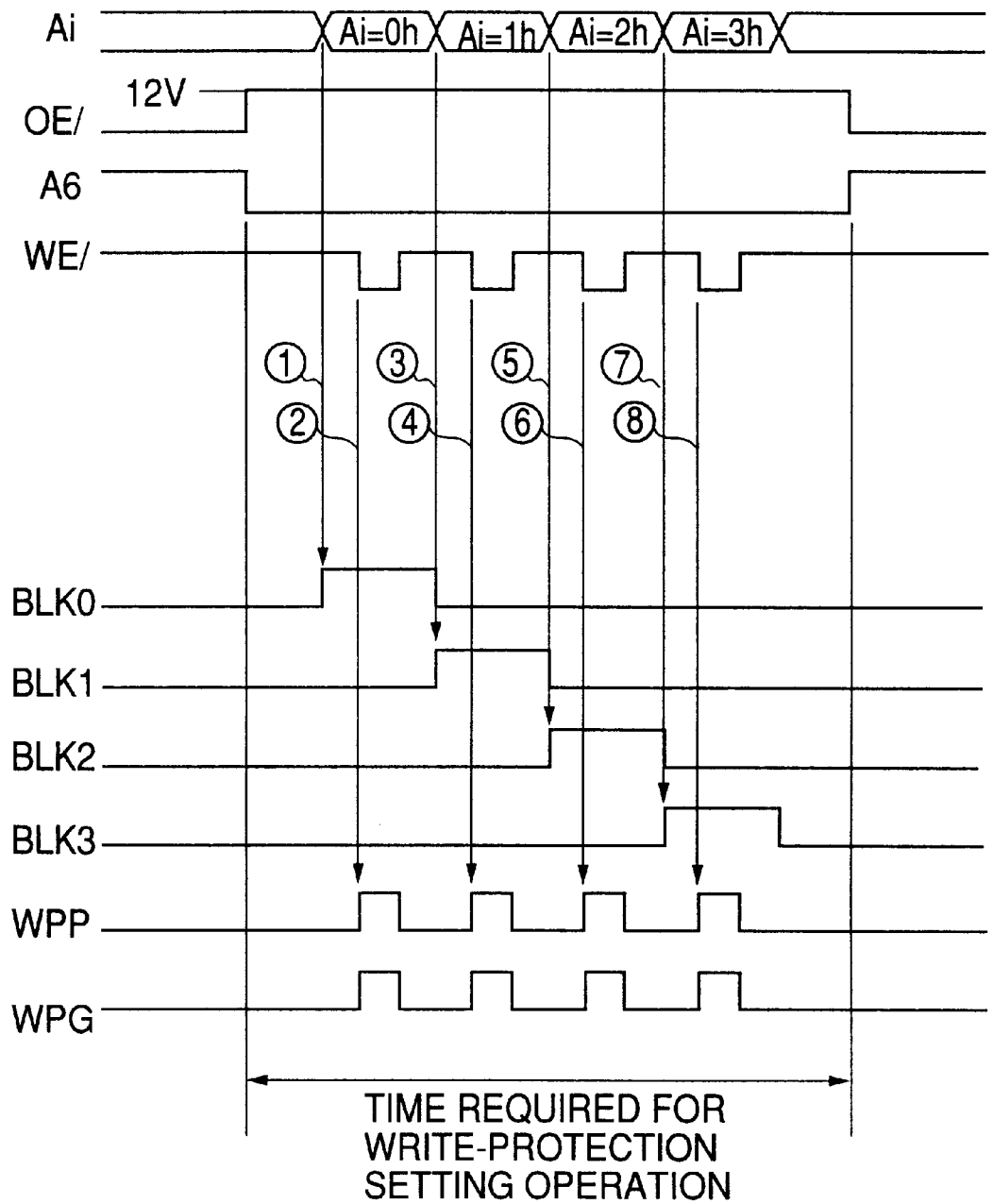
FIG. 3 is a time chart of a write-protection setting operation performed by the conventional write-protection circuit shown in FIG. 1.
Figure 4:
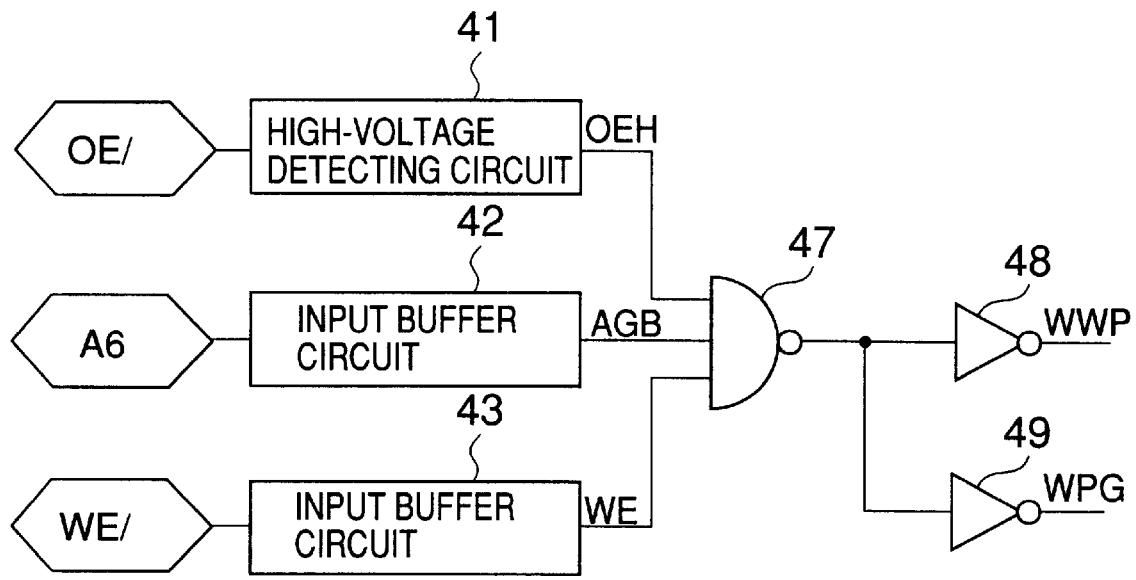
FIG. 4 is a circuit diagram of a write-protection control circuit shown in FIG. 1.
Figure 5:
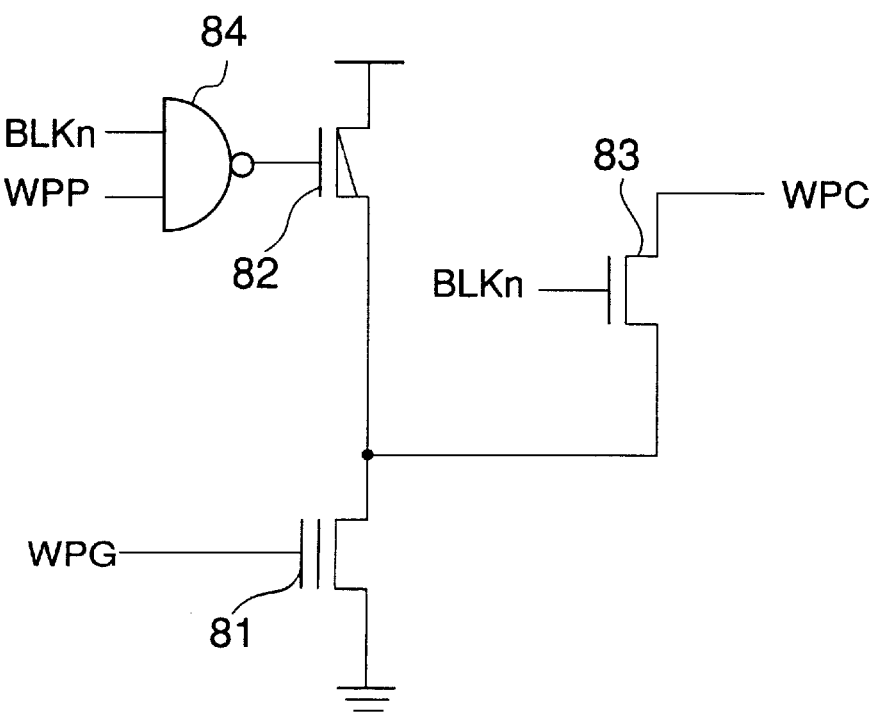
FIG. 5 is a circuit diagram of a write-protection memory circuit shown in FIG. 2.
Figure 6:
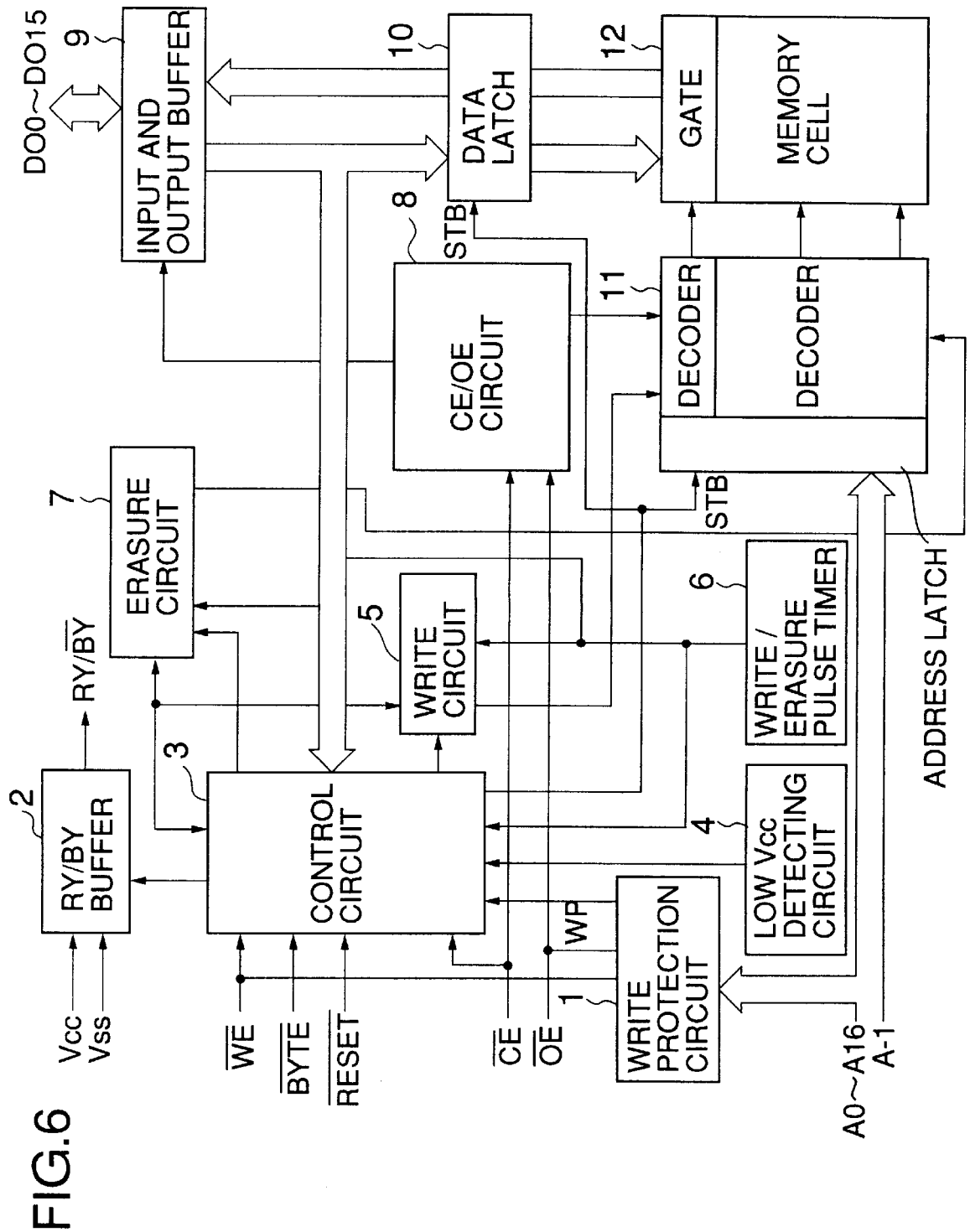
FIG. 6 is a block diagram of a semiconductor memory device according to a first embodiment of the present invention.

A description will now be given of a first embodiment of the present invention. FIG. 6 is a block diagram of the entire structure of a semiconductor memory device according to the first embodiment of the present invention.

The semiconductor memory device shown in FIG. 6 comprises a write-protection circuit 1, an RY/BY buffer 2, a control circuit 3, a low Vcc detecting circuit 4, a write circuit 5, a write/erasure pulse timer 6, an erasure circuit 7, a CE/OE circuit 8, an input and output buffer 9, a data latch 10, a decoder 11 and a memory cell 12. In the present embodiment, the write-protection circuit 1 is capable of setting write-protection information to a designated number of blocks at the same time. It should be noted that the memory cell 12 of the semiconductor memory device according to the present embodiment is divided into a plurality of blocks. The semiconductor memory device has a function to protect recorded information from being rewritten with respect to each of the blocks. That is, the semiconductor memory device according to the present embodiment has the write-protection function, and performs a setting operation of the write protection on an individual block basis.

The semiconductor memory device shown in FIG. 6 can perform regular operations the same as the conventional semiconductor memory device based on an address signal comprising seventeen bits A0 to A16 and control signals such as a write enable signal WE/, a chip enable signal CE/ and an output enable signal OE/. The regular operations include a process for reading data from the memory cell 12, a process for writing data In the memory cell 12, a process for erasing data in the memory cell 12 and a process for setting write-protection to a plurality of blocks by performing a plurality of setting operations. It should be noted that the number of bits of the address signal is not limited to seventeen, and is dependent on a capacity of the memory cell 12.

Additionally, the semiconductor memory device according to the present embodiment has a function to set the write-protection information to a designated number of blocks at one time. This operation is performed by the write-protection circuit 1.

Figure 7:
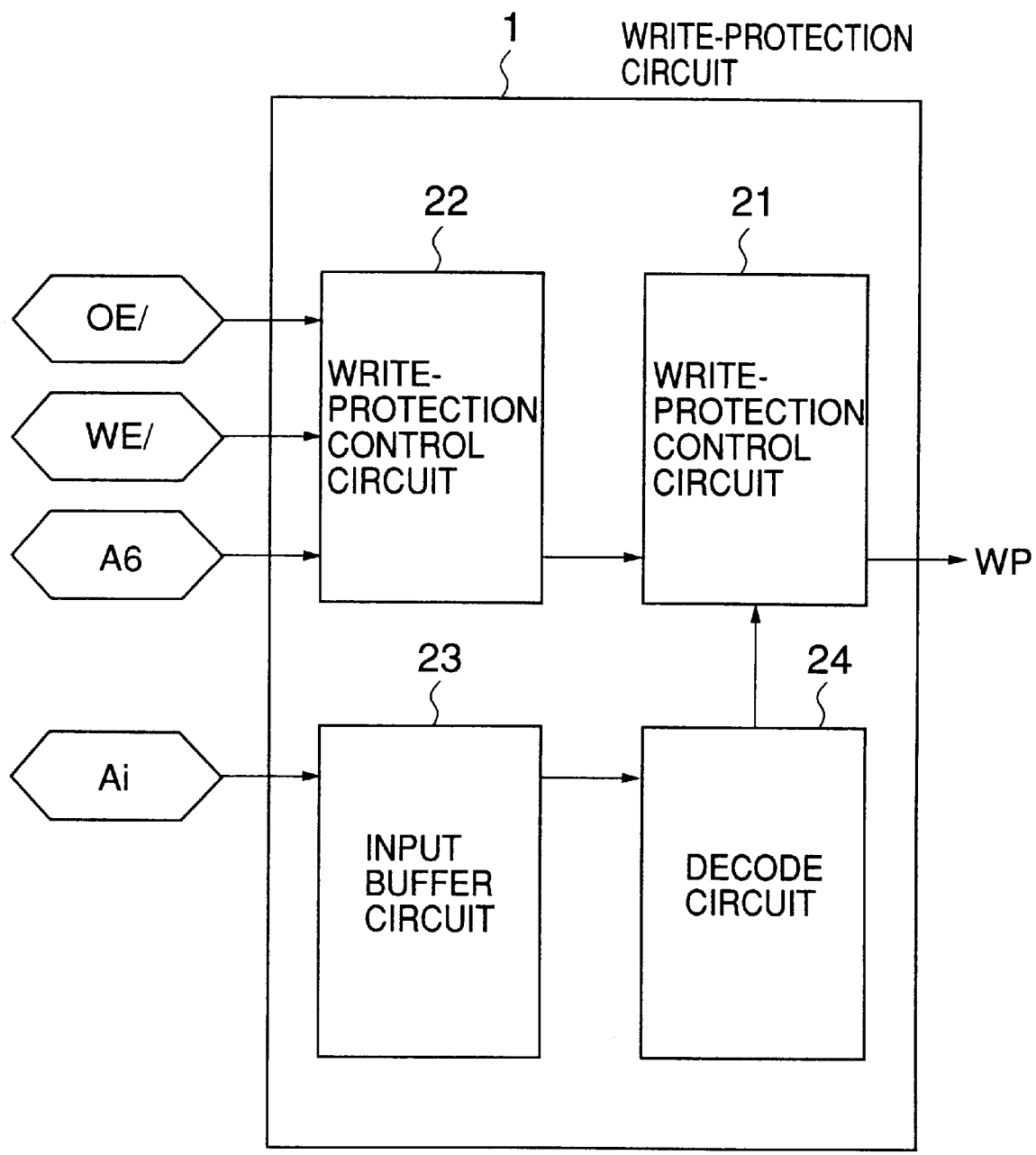
FIG. 7 is a block diagram of a write-protection circuit shown in FIG. 6.

FIG. 7 is a block diagram of the write-protection circuit 1 provided in the semiconductor memory device according to the present embodiment.

The write-protection circuit 1 comprises a write-protection control circuit 22, an input buffer circuit 23, a decode circuit 24 and a write-protection setting circuit 21 so as to perform the write-protection setting operation on an individual block basis in accordance with the external control signals OE/ and WE/ and the bit A6 of the address signal as a control signal for the write-protection setting operation. Additionally, the three most significant bits A14, A15 and A16 of the address signal are used as control signals for designating a block to which the write-protection setting operation is applied.

A description will now be given of each part included in the write-protection circuit 1 shown in FIG. 6.

Figure 8:
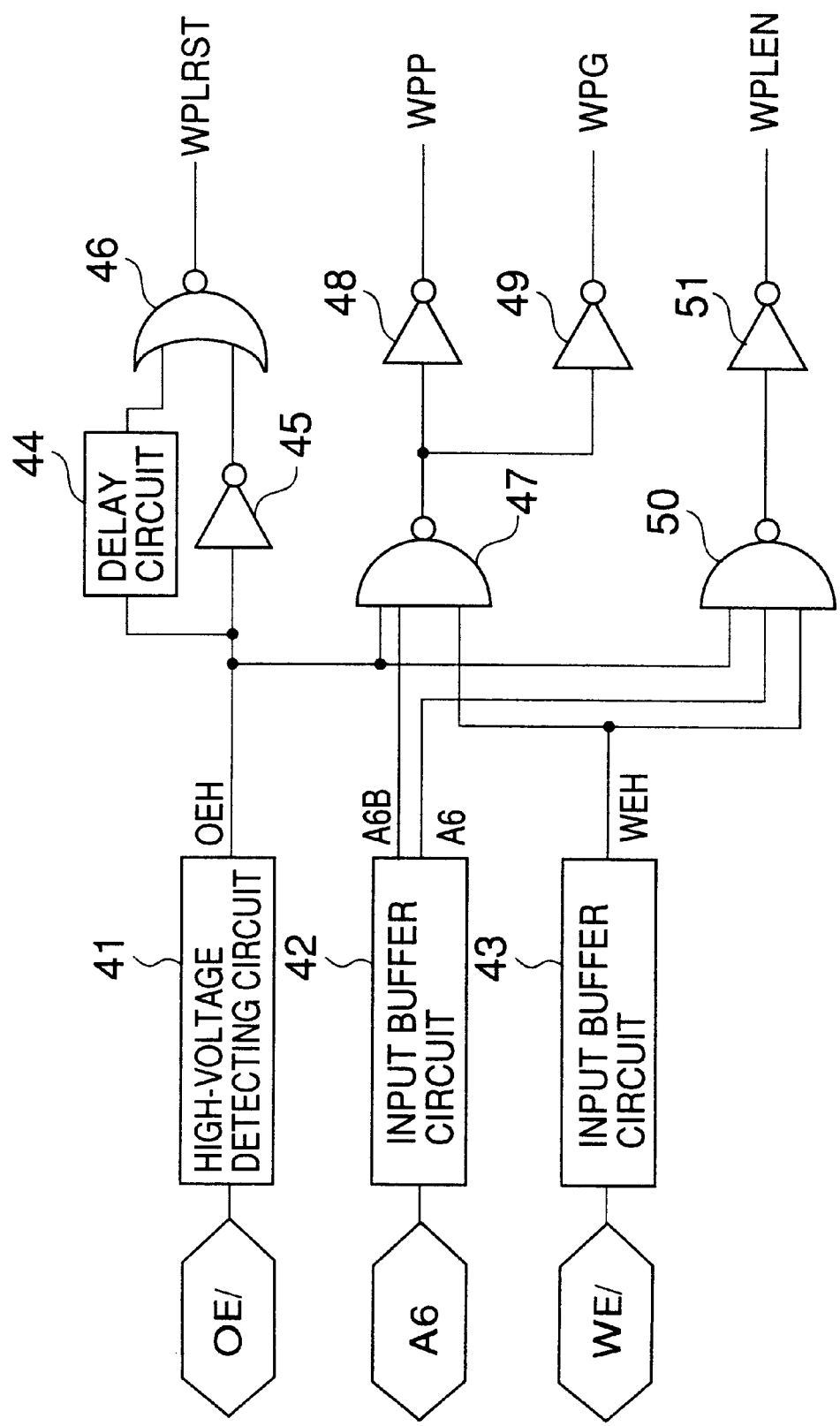
FIG. 8 is a circuit diagram of a write-protection control circuit shown in FIG. 7.

The write-protection control circuit 22 controls the operation for setting the write protect information. The write-protection control circuit 22 comprises, as shown in FIG. 8, a high-voltage detecting circuit 41 which outputs a signal OEH="H" when the control signal of 12V is detected; an input buffer circuit 42 which receives the address signal A6; an input buffer 43 which receives the control signal WE/; and various gates which control an operation for setting the write-protection information to a designated block. The gates includes a delay circuit 44, an inverter 45, a NOR gate 46, a NAND gate 47, inverters 48 and 49, a NAND gate 50 and an inverter 51.

The thus-constructed write-protection control circuit 22 generates a single pulse reset signal WPLRST when the control signal being changed from 0V to 12V is detected, so as to reset latch circuits 31a to 31g(refer to FIG. 12: described later). That is, the write-protection control circuit 22 generates the reset signal WPLRST by a differential operation by the delay circuit 44, the inverter 45 and the NOR gate 46 at a raising of the signal OEH from 0V to 5V.

Additionally, when the control signal OE/=12V, the control signal WE/="L" and the address signal A6="L", that is, when the write-protection information setting operation is performed, the write-protection control circuit 22 sets a write-protection information writing signal WPP to a high level "H" and also sets a control gate signal WPG to "Vcc".

On the other hand, when the control signal OE/=12V, the control signal WE/="L" and the address signal A6="H", the write-protection control circuit 22 sets an enable signal WPLEN of the latch circuits 31a to 31g to the high level "H".

Figure 9:
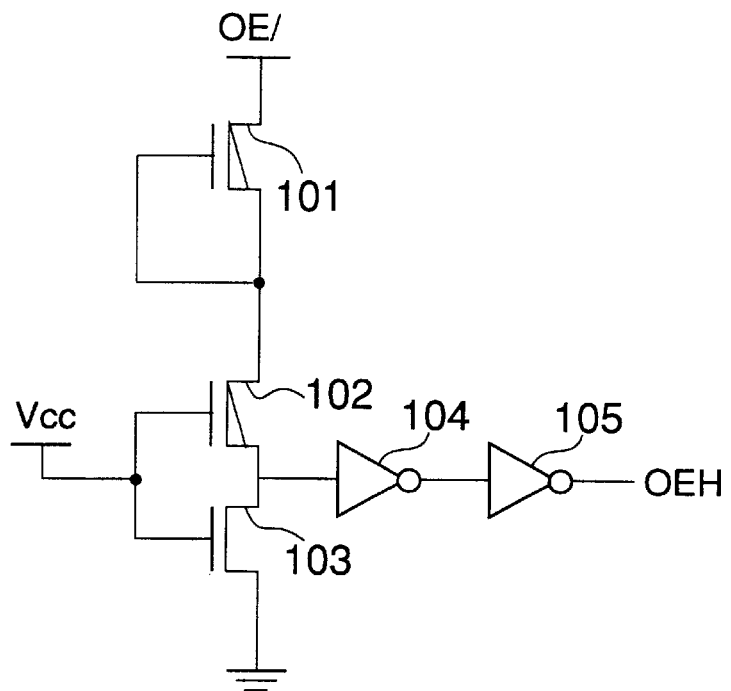
FIG. 9 is a circuit diagram of a high voltage detecting circuit shown in FIG. 8.
Figure 10:
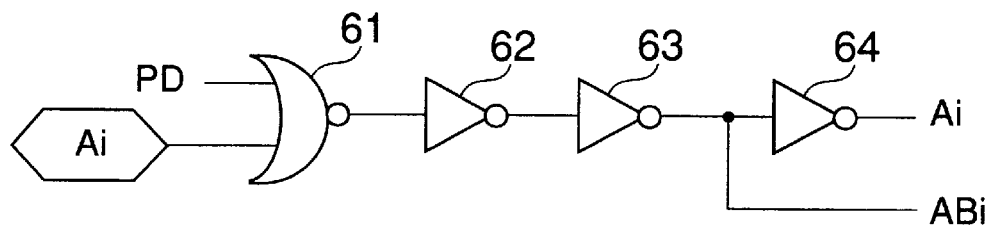
FIG. 10 is a circuit diagram of an input buffer circuit shown in FIG. 7.

The high-voltage detecting circuit 41 comprises, as shown in FIG. 9, P-channel transistors 101 and 102, an N-channel transistor 103 and inverters 104 and 105. The high-voltage detecting circuit 41 converts the control signal OE=12V into the signal OEH=5V. Additionally, each of the input buffer circuits 42 and 43 comprises, as shown in FIG. 10, a NOR gate 61 and inverters 62, 63 and 64. The input buffer circuits 42 and 43 input the address signal A6 and the control signal WE/, respectively, so as to drive the subsequent circuits. (In FIG. 10, the address signal Ai should be substituted by the address signal A6 or the control signal WE).

Additionally, the input buffer circuit 23 shown in FIG. 7 inputs the address signal Ai for designating blocks to which the write-protection setting operation is applied. Similar to the above-mentioned input buffer circuits 41 and 42, the input buffer circuit 23 comprises, as shown in FIG. 10, the NOR gate 61 and the inverters 62, 63 and 64. The input buffer circuit 23 inputs the address signal Ai so as to drive the subsequent circuit.

Figure 11:
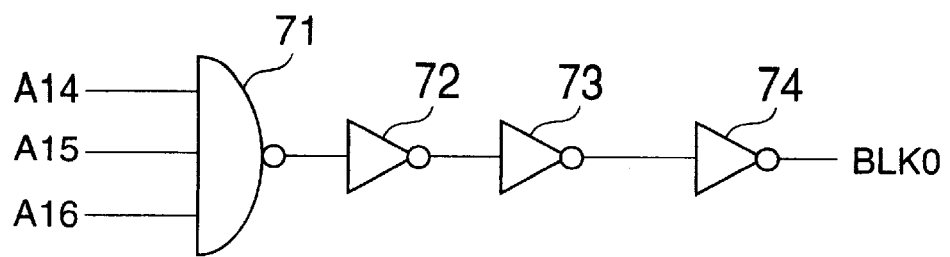
FIG. 11 is a circuit diagram of a decode circuit shown in FIG. 7.

The decode circuit 24 shown in FIG. 7 decodes the address signal Ai so as to designate blocks to which the write-protection information is set. The decode circuit 24 comprises, as shown in FIG. 11, a NAND gate 71 and inverters 72, 73 and 74. When the address signal A14="H", the address signal A15="H" and the address signal A16="H", for example, the decode circuit 24 sets a block signal BLK0, which designates the block 0. to a high level "H". It should be noted that the decode circuit 24 can generate eight block signals BLK0 to BLK7 by changing levels of the bit signals A14, A15 and A16 of the address signal Ai. Additionally, a greater number of blocks can be designated by increasing the number of bit signals included in the address signal Ai.

The write-protection setting circuit 21 shown in FIG. 7 performs an operation for setting the write-protection with respect to a block designated by the decode circuit 24. The write-protection setting circuit 21 comprises, as shown in FIG. 12, the latch circuits 31a to 31g, write-protection memory circuits 32a to 32g and a read circuit. Each of the latch circuits 31a to 31g latches a block signal BLKn (n represents a block number) for each of the blocks of the memory cell 12. Each of the write-protection memory circuits 32a to 32g stores the write-protection information BLKLn (n represents a block number) provided from the respective latch circuits 31a to 31g. The read circuit comprises an N-channel transistor 33, a resistor 34 and inverters 35 and 36. The read circuit reads the write-protection information stored in each of the write-protection memory circuits which corresponds to the block to be subjected to a write operation. The write-protection information read by the read circuit is output as a write-protection signal WP. It should be noted that the number of latch circuits 31a to 31g and the number of write-protection memory circuits 32a to 32g are not limited to the number of circuits indicated in the drawing, and are set to be equal to the number of blocks provided in the memory cell 12.

It should be noted that the write-protection information indicates whether each block is write-protected or the write protection is canceled. For example, if the write-protection information (the write-protection signal WP) is at a high level "H", the corresponding block is recognized as being write-protected. On the other hand, if the write-protection signal WP is at a low level "L", the write-protection of the corresponding block is recognized as being canceled.

Figure 12:
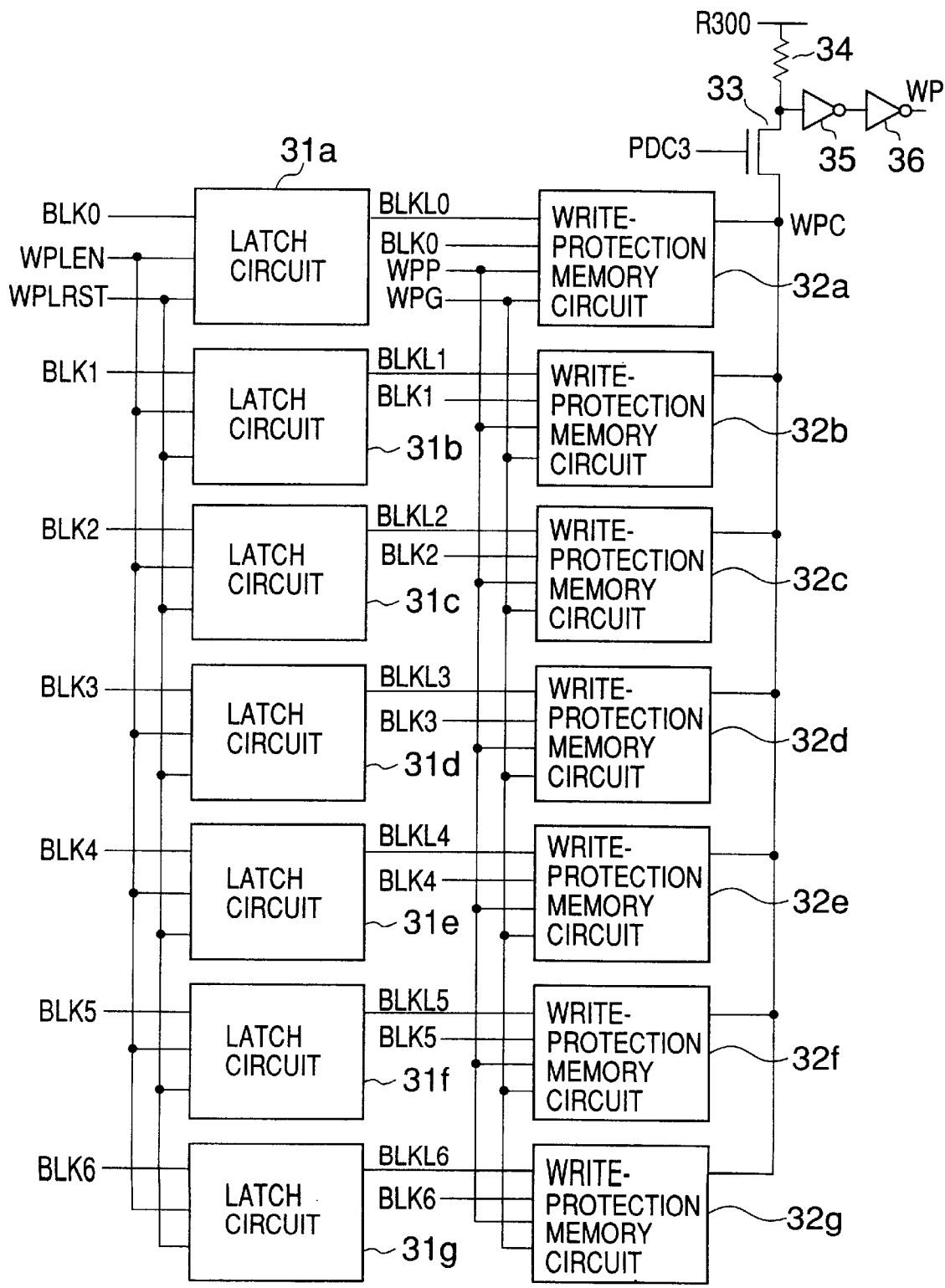
FIG. 12 is a block diagram of a write-protection setting circuit shown in FIG. 7.
Figure 13:
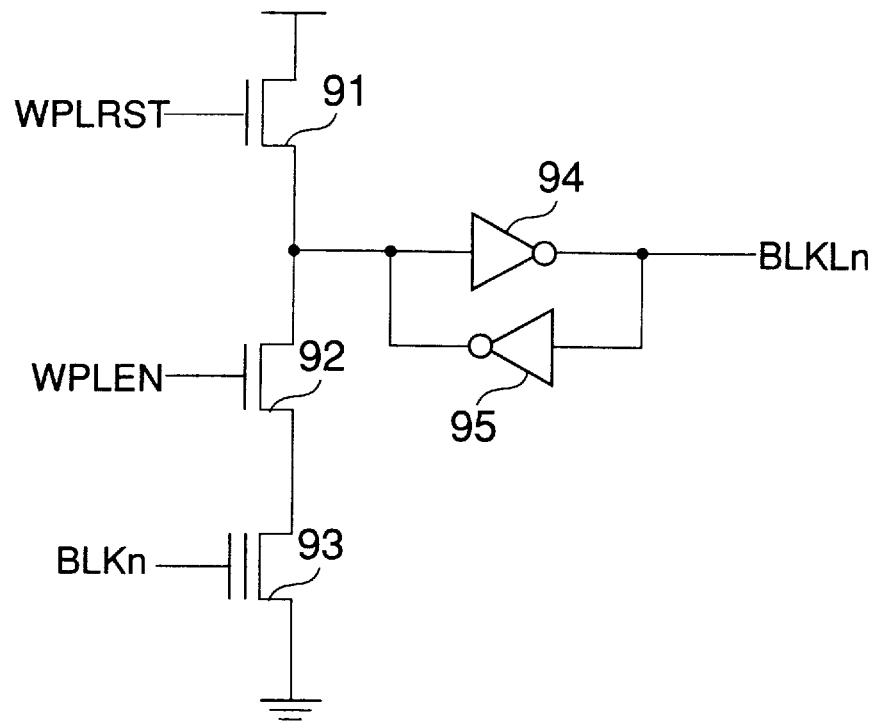
FIG. 13 is a circuit diagram of a latch circuit shown in FIG. 12.

Each of the latch circuits 31a to 31g in the write-protection setting circuit 21 shown in FIG. 12 comprises, as shown in FIG. 13, N-channel transistors 91, 92 and 93 and inverters 94 and 95. Each of the latch circuits 31a to 31g latches the block signal BLKn="H" and outputs the signal BLKn as the write-protection information when the reset signal WPLRST from the write-protection control circuit 22 is at a low level "L" and the enable signal WPLEN from the write-protection control circuit 22 is at a high level "H".

Figure 14:
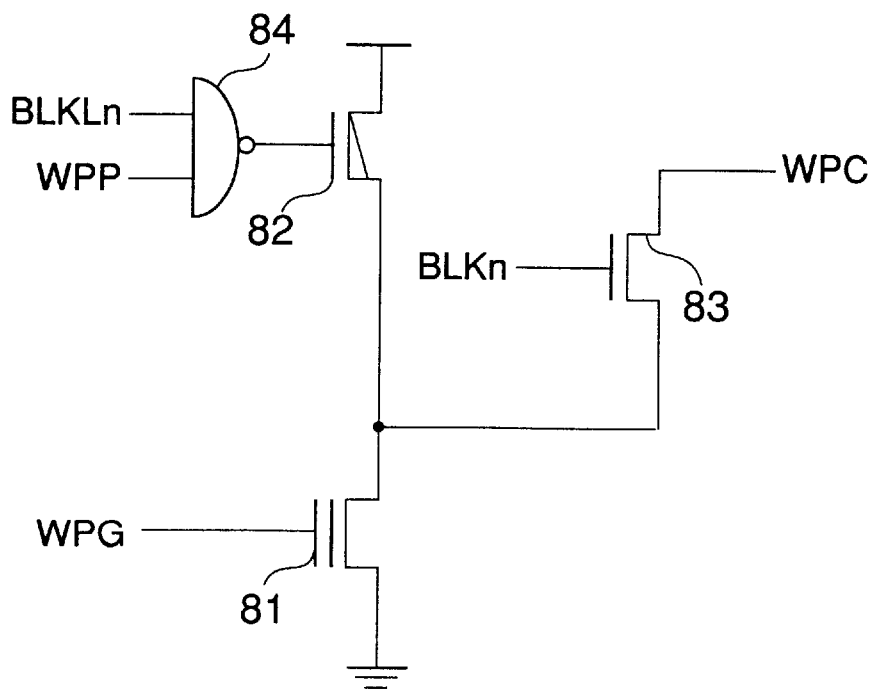
FIG. 14 is a circuit diagram of a write-protection memory circuit shown in FIG. 12.

Additionally, each of the write-protection memory circuits 32a to 32g shown in FIG. 12 comprises, as shown in FIG. 14, a memory circuit (a content addressable memory (CAM) cell) 81, a P-channel transistor 82, an N-channel transistor 83 and a NAND gate 84. Each of the write-protection memory circuits 32a to 32g stores the write-protection information BLKn in the memory circuit 81, which corresponds to the designated block n, when the write-protection information writing signal WPP from the write-protection control circuit 22 is at a high-level "H" and the control gate signal WPG from the write-protection control circuit 22 is at "Vcc".

Accordingly, when there is a plurality of blocks to be write-protected in the memory cell 12, that is, for example, when the block 0, block 1, block 2 and block 3 are to be write-protected, the latch circuits 31a, 31b, 31c and 31d of the write-protection setting circuit 21 latch the respective block signals BLK0="H", BLK1="H", BLK2="H" and BLK3="H". Then, the write-protection information writing signal WPP is set to "H" and the control gate signal WPG is set to "Vcc", and, thereby, the plurality of blocks BLK0, BLK1, BLK2 and BLK3 can be simultaneously subjected to the write-protection setting operation.

Additionally, since outputs of the write-protection memory circuits are connected in a wired-OR structure, the control circuit shown in FIG. 6 can read the write-protection signal WP of a designated one of the blocks by designating the one of the blocks to be subjected to a data writing operation and changing a PDCB signal from 0V to 0.5V so as to turn on the N-channel transistor 33.

A description will now be given, with reference to FIG. 15, of a write-protection setting operation performed by the write-protection circuit 1 of the semiconductor memory device shown in FIG. 6.

Figure 15:
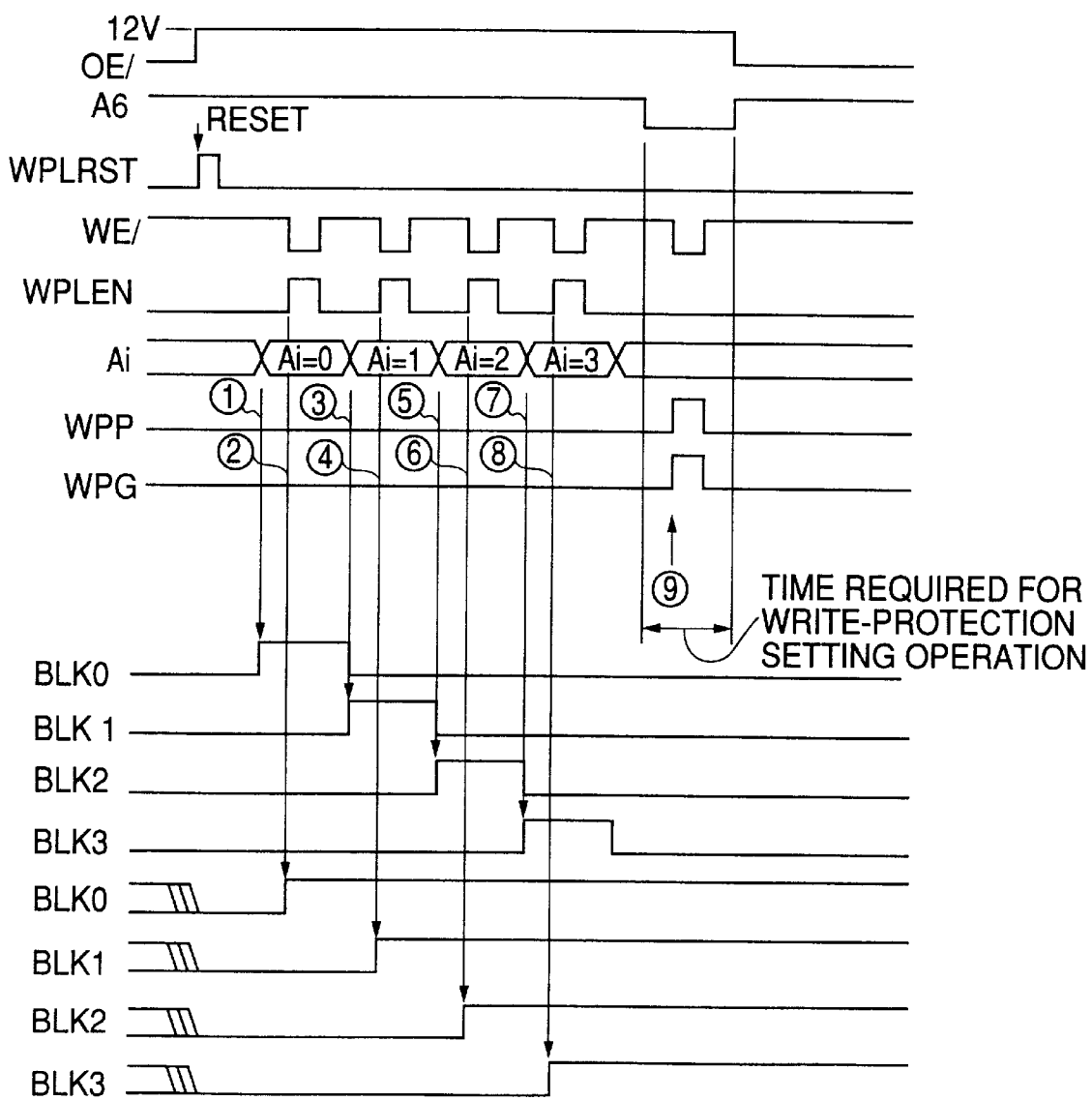
FIG. 15 is a time chart for explaining an operation for setting write protection performed by the semiconductor memory device shown in FIG. 6.

FIG. 15 is a time chart of the signals used for the write-protection setting operation performed by the write-protection circuit 1. The time chart of FIG. 15 corresponds to a case in which the block 0, the block 1, the block 2 and the block 3 are subjected to the write-protection setting operation.

When a change in the control signal OE/ from 0V to 12V is detected by the high-voltage detecting circuit 41, the signal OEH is changed from 0V to 5V. Thus, the pulseed reset signal WPLRST having the high level "H" is output. Thereby, the write-protection information BLKn of the latch circuits 31a to 31g is reset.

When the address signal Ai (A16="L", A15="L" and A14="L") is input to the input buffer circuit 23, the decode circuit 24 decodes the address signal Ai so as to designate, for example, the block 0 as a block to be write-protected. Accordingly, the block signal BLK0 corresponding to the block 0 is set to "H" (FIG. 15-①).

In this state, when the control signal OE/=12V is continuously output and the address signal A6="H" and the control signal WE/="L" are input via the input buffer circuits 42 and 43, respectively, the enable signal WPLEN is changed to "H". Accordingly, the latch circuit 31a latches the block signal BLK0 at a rising of the enable signal WPLEN (FIG. 15-②).

Thereafter, when the address signal Ai (A16, A15, A14) sequentially changes as "LLH"→"LHL"→"LHH", the decode circuit 24 sequentially designates the block 1, the block 2 and the block 3, in that order. Accordingly, the block signals BLK1, BLK2 and BLK3 are set to "H" in each respective timing (FIG. 15-③⑤⑦).

Additionally, similar to FIG. 15-②, the latch circuits 31b, 31c and 31d also latch the block signals BLK1, BLK2 and BLK3, respectively, at each respective timing (FIG. 15-④⑥⑧).

In this state, the write-protection control circuit 22 outputs the write signal WPP and the control gate signal WPG for controlling the setting operation of the write-protection.

That is, when the control signal OE/=12V is recognized as being continuously output, and the address signal A6="L" and the control signal WE="L", the write-protection control circuit 22 sets the signal WPP to "H" and the signal WPG to "Vcc" (FIG. 15-⑨).

The write-protection memory circuits 32a, 32b, 32c and 32d store the respective write-protection information BLK0, BLK1, BLK2 and BLK3 at a rising timing indicated by FIG. 15-⑨.

As mentioned above, when there is a plurality of blocks to be write-protected, the semiconductor memory device according to the present embodiment can reduce a time required for performing the operation for setting the write protection by simultaneously performing the setting operations with respect to all of the blocks to be write-protected.

A description will now be given of a second embodiment of the present invention. A semiconductor memory device according to the second embodiment of the present invention has the same structure as the semiconductor memory device shown in FIG. 6 except for the write-protection setting circuit 21 being replaced by a write-protection setting circuit 21a.

Figure 16:
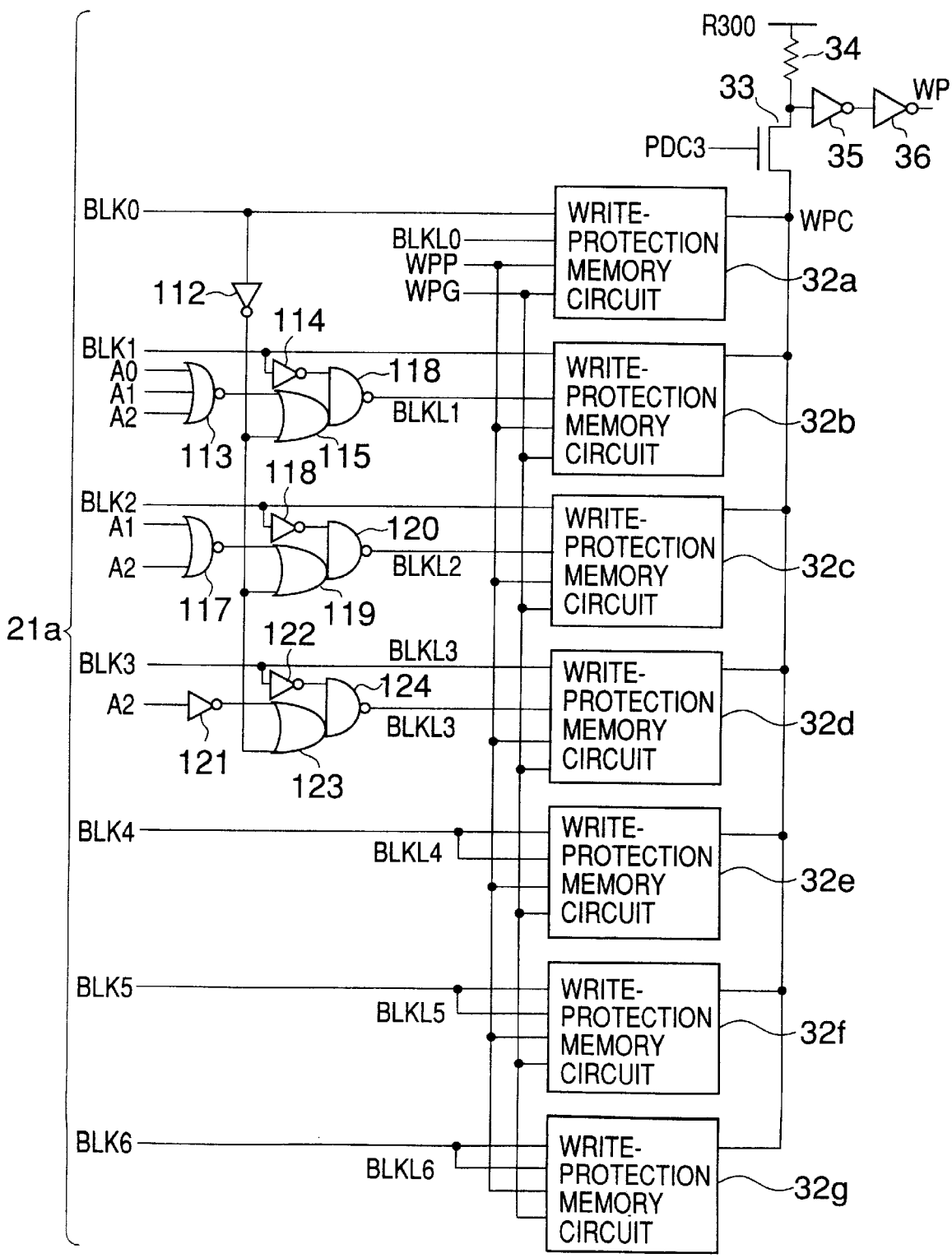
FIG. 16 is a circuit diagram of a write-protection setting circuit of a semiconductor memory device according to a second embodiment of the present invention.

FIG. 16 is a circuit diagram of the write-protection setting circuit 21a. In FIG. 16, parts that are the same as the parts shown in FIG. 12 are given the same reference numerals, and descriptions thereof will be omitted.

Similar to the write-protection setting circuit 21 shown in FIG. 12, the write-protection setting circuit 21a shown in FIG. 16 performs an operation for setting the write protection with respect to blocks designated by the decode circuit 24 under the control of the write-protection control circuit 22. The write-protection setting circuit 21a comprises, as shown in FIG. 16, the write-protection memory circuits 32a to 32g, a combination circuit and a read circuit. Each of the write-protection memory circuits 32a to 32g stores the block signal BLKn (n represents a block number) provided from the decode circuit 24 as write-protection information BLKLn. The combination circuit comprises, as shown in FIG. 16, inverters 112, 114, 118, 121 and 122, NOR gates 113 and 117, OR gates 115, 119 and 123 and NAND gates 116, 120, and 124 that are connected as shown in FIG. 16. The read circuit comprises an N-channel transistor 33, a resistor 34 and inverters 35 and 36. The read circuit reads the write-protection information stored in each of the write-protection memory circuits 32a to 32g which corresponds to the block to be subjected to a write operation. The write-protection information read by the read circuit is output as a write-protection signal WP. It should be noted that the number of write-protection memory circuits 32a to 32g is not limited to the number of the circuits indicated in the drawing, and is set to be equal to the number of blocks provided in the memory cell 12.

It should be noted that the write-protection information indicates whether each block is write-protected or the write-protection is canceled. For example, if the write-protection information (the write-protection signal WP) is at a high level "H", the corresponding block is recognized as being write-protected. On the other hand, if the write-protection signal WP is at a low level "L", the write-protection of the corresponding block is recognized as being canceled.

The combination circuit shown in FIG. 16 generates the write-protection information BLK1, BLK2 and BLK3, and performs the following operations.

When the block 0 is to be write-protected (the block signal BLK0="H") and the address signals A2, A1 and A0 are "LLL", only the write-protection information BLKL0="H" is stored in the write-protection memory circuit 32a.

When the block 0 is to be write-protected (the block signal BLK0="H") and the address signals A2, A1 and A0 are "LLH", the write-protection information BLKL0="H" and BLKL1="H" are stored in the write-protection memory circuits 32a and 32b, respectively.

When the block 0 is to be write-protected (the block signal BLK0="H") and the address signals A2 and A1 are "LH", the write-protection information BLKL0="H", BLKL1="H" and BLKL2="H" are stored in the write-protection memory circuits 32a, 32b and 32c, respectively.

When the block 0 Is to be write-protected (the block signal BLK0="H") and the address signal A2 is "H", the write-protection information BLKL0="H", BLKL1="H", BLKL2="H" and BLKL3="H" are stored in the write-protection memory circuits 32a, 32b, 32c and 32d, respectively.

As mentioned above, according to the write-protection setting circuit 21a provided in the semiconductor memory device according to the present embodiment, three blocks other than the block designated by the decode circuit 24 can be designated at the same time. Accordingly, in the semiconductor memory device according to the present embodiment, the write-protection information can be simultaneously set to a plurality of blocks which are designated by both the decode circuit 24 and the combination circuit. It should be noted that the address signals decoded by the combination circuit can be signals other than the address signals A2, A1, A0. Additionally, write-protection can be set to a greater number of blocks at the same time by increasing the number of bits included in the signal to be decoded.

Additionally, in the semiconductor memory device having the write-protection setting circuit 21a, the write-protection setting operation can be simultaneously performed with respect to a plurality of consecutive blocks of which a first block is the block designated by the decode circuit 24. This setting operation is particularly effective for the following case in which a flash memory is used.

For example, a flash memory used for storing control programs of a basic input/output system (BIOS) has boot blocks that store boot programs. The boot blocks are consecutively arranged from the first block position since the flash memory is always read from the first address during a boot operation.

Since the BIOS is not rewritten in a regular system operation, consecutive blocks starting from the first block in the flash memory storing the BIOS are to be write-protected so that the BIOS is not erroneously rewritten or changed.

Additionally, if the memory area for storing the BIOS is expanded when the system is expanded, the boot blocks must be consecutively arranged from the first block position. In such a case, according to the semiconductor memory device having the write-protection setting circuit 21a, the boot blocks can be write-protected by decoding predetermined signals such as the address signals A2, A1, A0 similar to the write-protection performed before the expansion. Additionally, the control programs for the write-protection can be simplified and rendered to be commonly usable. It should be noted that although the above description is directed to a case in which the boot blocks are arranged at the beginning of the consecutive blocks (top boot block), the same effect can be obtained when the boot blocks are arranged at the end of the consecutive blocks (bottom boot block).

The present invention is not limited to the specifically disclosed embodiments, and variations and modifications may be made without departing from the scope of the present invention.

The present application is based on Japanese priority application No. 10-14390 filed on Jan. 27, 1998, the entire contents of which are hereby incorporated by reference.

What is claimed is:

1. A semiconductor memory device, comprising:
 a write area divided into a predetermined number of blocks each of which is rewritable on an individual block basis; and
 write-protection means for simultaneously setting write-protection information to a plurality of blocks that are arbitrarily designated from among the predetermined number of blocks so that said plurality of blocks are protected from being rewritten.

2. A semiconductor memory device comprising:

a write area divided into a predetermined number of blocks each of which is rewritable on an individual block basis; and write-protection means for simultaneously setting write-protection information to a plurality of blocks that are arbitrarily designated from among the predetermined number of blocks so that said plurality of blocks are protected from being rewritten, wherein the write-protection means further comprises:

decode means for decoding an address signal for designating said plurality of blocks to which the write-protection information is set; and write-protection control means for controlling an operation for setting the write-protection information based on externally provided control signals, wherein said write-protection means simultaneously sets the write-protection information to said plurality of blocks designated by said decode means under a control of said write-protection control means.

3. The semiconductor memory device as claimed in claim 2, wherein said write-protection means further comprises:

latch means for latching a decode signal on an individual block basis, said decode signal indicating said plurality of blocks to which the write-protection information is to be provided; and write-protection memory means for storing the write-protection information on an individual block basis based on the decode signal latched by said latch means, wherein the decode signal corresponding to said plurality of blocks is previously latched by said latch means, and, thereby, the write-protection information is simultaneously set to said plurality of blocks to which the write-protection information is to be provided.

4. The semiconductor memory device as claimed in claim 2, wherein said write-protection means further comprises:

input-signal decode means for decoding input signals other than the address signal so as to designate at least one of the blocks other than the block designated by said decode means at the same time as when the block is designated by said decode means; and write-protection memory means for storing the write-protection information on an individual block basis based on a first decoded signal obtained by said decode means and a second decoded signal obtained by said input-signal decode means, wherein the write-protection information is set to a plurality of blocks designated by said decode means and said input-signal decode means.

5. The semiconductor memory device as claimed in claim 4, wherein the block designated by said input-signal decode means and the block designated by said decode means are consecutively arranged with the block designated by said decode means being positioned at the beginning or at the end of the consecutive blocks.

6. A semiconductor memory device, comprising:

a write area divided into a predetermined number of blocks each of which is rewritable on an individual block basis; and write-protection circuit simultaneously setting write-protection information to a plurality of blocks that are arbitrarily designated from among the predetermined number of blocks so that said plurality of blocks are protected from being rewritten.

7. A semiconductor memory device comprising:

a write area divided into a predetermined number of blocks each of which is rewritable on an individual block basis; and a write-protection circuit simultaneously setting write-protection information to a plurality of blocks that are arbitrarily designated from among the predetermined number of blocks so that said plurality of blocks are protected from being rewritten, wherein said write-protection circuit comprises:

a decode circuit for decoding and address signal and outputting block signals indicating said plurality of blocks to be provided with the write-protection information; and a write-protection control circuit controlling an operation for setting the write-protection information based on an externally provided control signal, wherein said write-protection circuit simultaneously sets the write-protection information to said plurality of blocks designated by said decode circuit under a control of said write-protection control circuit.

8. The semiconductor memory device as claimed in claim 7, wherein said write-protection circuit further comprises:

a plurality of latch circuits each of which latches a corresponding one of the block signals output from said decode circuit, the block signals indicating said plurality of blocks to be provided with the write-protection information; and a plurality of write-protection memory circuits each of which stores the write-protection information on an individual block basis based on the block signals latched by said latch circuits, wherein the block signals corresponding to said plurality of blocks are previously latched by said latch circuits, and, thereby, the write-protection information is simultaneously set to said plurality of blocks.

9. The semiconductor memory device as claimed in claim 7, wherein said write-protection circuit further comprises:

an input-signal decode circuit decoding input signals other than the address signal so as to designate at least one of the blocks other than the block designated by said decode circuit at the same time as when the block is designated by said decode circuit; and a write-protection memory circuit for storing the write-protection information on an individual block basis based on one of the block signals output from said decode circuit and a decoded signal obtained by said input-signal decode circuit, wherein the write-protection information is set to a plurality of blocks designated by said decode circuit and said input-signal decode circuit.

10. The semiconductor memory device as claimed in claim 9, wherein the block designated by said input-signal decode circuit and the block designated by said decode circuit are consecutively arranged with the block designated by said decode circuit being positioned at the beginning or at the end of the consecutive blocks.

* * * * *